United States Patent
Nakao

(10) Patent No.: US 11,550,010 B2
(45) Date of Patent: Jan. 10, 2023

(54) APPARATUS AND METHOD FOR PROCESSING SPECTRUM

(71) Applicant: JEOL Ltd., Tokyo (JP)

(72) Inventor: Tomoki Nakao, Tokyo (JP)

(73) Assignee: JEOL Ltd., Tokyo (JP)

( * ) Notice: Subject to any disclaimer, the term of this patent is extended or adjusted under 35 U.S.C. 154(b) by 1043 days.

(21) Appl. No.: 16/240,068

(22) Filed: Jan. 4, 2019

(65) Prior Publication Data

US 2019/0219651 A1 Jul. 18, 2019

(30) Foreign Application Priority Data

Jan. 12, 2018 (JP) .............................. JP2018-003522

(51) Int. Cl.
| | |
|---|---|
| G01R 33/46 | (2006.01) |
| G06N 7/00 | (2006.01) |
| G06N 5/00 | (2006.01) |
| G06F 17/17 | (2006.01) |
| G06F 17/16 | (2006.01) |

(52) U.S. Cl.
CPC ......... *G01R 33/4625* (2013.01); *G06F 17/17* (2013.01); *G06N 5/003* (2013.01); *G06N 7/00* (2013.01); *G06F 17/16* (2013.01)

(58) Field of Classification Search
None
See application file for complete search history.

(56) References Cited

U.S. PATENT DOCUMENTS

| | | | | |
|---|---|---|---|---|
| 2002/0145425 | A1* | 10/2002 | Ebbels | G01R 33/4625 324/309 |
| 2006/0255258 | A1* | 11/2006 | Wang | G06K 9/00496 250/282 |

(Continued)

FOREIGN PATENT DOCUMENTS

| | | |
|---|---|---|
| JP | 62124450 A | 6/1987 |
| JP | H04364490 A | 12/1992 |

(Continued)

OTHER PUBLICATIONS

Shujian Yu, Xinge You, Yi Mou, Xiubao Jiang, Weihua Ou, Long Zhou; "A New Approach for Spectra Baseline Correction Using Sparse Representation;" Feb. 2013; The 10th IASTED International Conference on. Signal Processing, Pattern Recognition and Applications; p. 1-6 (Year: 2013).*

(Continued)

*Primary Examiner* — Ricky Go
(74) *Attorney, Agent, or Firm* — The Webb Law Firm

(57) ABSTRACT

A spectrum y includes a waveform-of-interest component and a baseline component serving as a wide-band component. An optimum solution of a signal model x is determined according to a first condition to fit a corresponding portion $S_I F x$ of a baseline model Fx with respect to a representative portion $y_I$ of the baseline component, and a second condition to minimize an Lp norm (wherein $p \leq 1$) of the signal model x. An estimated baseline component determined from the optimum solution of the signal model x is subtracted from the spectrum y.

8 Claims, 8 Drawing Sheets

(56) References Cited

U.S. PATENT DOCUMENTS

| 2008/0201087 | A1* | 8/2008 | Bruschweiler | G01N 24/08 |
| | | | | 702/32 |
| 2014/0064586 | A1* | 3/2014 | Peacock, III | A61B 5/4824 |
| | | | | 382/131 |
| 2015/0011893 | A1 | 1/2015 | Lui et al. | |
| 2019/0011408 | A1 | 1/2019 | Noda | |

FOREIGN PATENT DOCUMENTS

| JP | 200159772 | A | 3/2001 |
| JP | 200848878 | A | 3/2008 |
| WO | 2017119086 | A1 | 7/2017 |

OTHER PUBLICATIONS

Mallet, Stephane G, Zhang, Zhifeng; "Matching Pursuits With Time-Frequency Dictionaries;" Dec. 1993; IEEE Transactions on Signal Processing vol. 41, No. 12; p. 3397-3415 (Year: 1993).*

Majumdar, Angshul; Ward, Rabab; "An algorithm for sparse MRI reconstruction by Schatten p-norm minimization"; 2011; Magnetic Resonance Imaging 29 (2011); pp. 408-417 (Year: 2011).*

Office Action issued in JP2018003522 dated Jun. 1, 2021.

Tanaka; Translation of Excerpt from "Mathematics of Compressed Sensing"; IEICE Fundamentals Review, vol. 4, Issue 1, 2010, pp. 39-47.

Kigawa et al.; Translation of Excerpt from "Initiative for faster and more precise NMR data measurement and analysis with sparse modeling"; 2017 Fiscal Year Annual Research Report in Project Field of "Initiative for High-Dimensional Data-Driven Science through Deepening of Sparse Modeling" by Institute of Physical and Chemical Research in Project Period Jun. 28, 2013 to Mar. 31, 2018.

Sigl, Nonlinear Residual Minimization by Iteratively Reweighted Least Squares, Technische Universität München Fakultät für Mathematik, Apr. 28, 2015, pp. 1-37, Garching bei München.

More, The Levenberg-Marquardt Algorithm: Implementation and Theory, Conference on Numerical Analysis University of Dundee, Scotland, Argonne National Laboratory operated under contract W-31-109-Eng-38 for the U.S. Energy Research and Development Administration, Jun. 28-Jul. 1, 1977, pp. 1-12, Argonne, Illinois.

Laatikainen et al., A Computational Strategy for the Deconvolution of NMR Spectra with Multiplet Structures and Constraints: Analysis of Overlapping 13C-2H multiplets of 13C Enriched Metabolites from Cell Suspensions Incubated in Deuterated Media, Kuopio NMR Research Group et al., Apr. 12, 12996, pp. 359-365, Brussel, Belgium.

Soininen et al., Strategies for organic impurity quantification by HNMR spectroscopy: Constrained total-line-shape fitting, Analytica Chimica Acta, Mar. 24, 2005, pp. 178-185, vol. 542, Finland.

Daubechies et al., Iteratively Reweighted Least Squares Minimization for Sparse Recovery, Communications on Pure and Applied Mathematics, 2010, pp. 1-38, vol. LXIII, New York.

\* cited by examiner

Input $y$ and $I$.                                  ...(S10)
Compose $S_I$, $F$                                  ...(S12)
$B = S_I F$                                         ...(S14)
$y_I = S_I y$                                       ...(S16)
$L_f = \max(\text{eig}(B^H B))$                     ...(S18)
Initialization
$x_0 = B^+ y_I$ and $k = 0$.
while $k <= k_{max}$ do                             ...(S20)
    $x_{k+1} = x_k + \frac{1}{L_f} B^H (y_I - Bx_k)$   ...(S22)
    $x_{k+1} = \text{soft}\left(x_{k+1}, \frac{\lambda}{L_f}\right)$   ...(S24)
    $k = k + 1$                                     ...(S26)
end while                                           ...(S28)

FIG. 4

Input $y$ and $I$, $p(\leq 1)$.  ···(S10a)
$\epsilon(>0)$, $\lambda(>0)$  ···(S30)
Compose $S_I$, $F$  ···(S12)
$B = S_I F$  ···(S14)
$y_I = S_I y$  ···(S16)
Initialization
$x_0 = B^+ y_I$ and $k = 0$.  ···(S20)
while $k <= k_{max}$ do  ···(S22)
$\quad w_i = [||x_k(i)| + \epsilon|^{(p-2)/2}$  ···(S32)
$\quad W = \text{diag}([w_1, \ldots, w_N])$  ···(S34)
$\quad x_{k+1} = (B^H B + \lambda W^T W)^+ B^H y_I$  ···(S36)
$\quad k = k + 1$  ···(S28)
end while

FIG. 7

Input $y$ and $I$, $p(\leq 1)$. ...(S10a)
$\epsilon(> 0)$ ...(S30a)
Compose $S_I$, $F$ ...(S12)
$B = S_I F$ ...(S14)
$y_I = S_I y$ ...(S16)
Initialization
$x_0 = B^+ y_I$ ...(S20)
while $k <= k_{max}$ do ...(S22)
$\quad w_i = [|x_k(i)| + \epsilon]^{(p-2)/2}$ ...(S32)
$\quad W = \text{diag}([w_1, \ldots, w_N])$ ...(S34)
$\quad x_{k+1} = W^{-1} B^H (BW^{-1}W^{-1}B^H)^+ y_I$ ...(S38)
$\quad k = k + 1$ ...(S28)
end while

FIG. 8

APPARATUS AND METHOD FOR PROCESSING SPECTRUM

CROSS-REFERENCE TO RELATED APPLICATION

This application claims priority to Japanese Patent Application No. 2018-003522 filed Jan. 12, 2018, the disclosure of which is hereby incorporated in its entirety by reference.

BACKGROUND

Field of the Invention

The present disclosure relates to an apparatus and a method for processing a spectrum, and in particular to estimation of a baseline component.

Description of Related Art

As a spectrum to be a target of a spectrum analysis, there are known an NMR (Nuclear Magnetic Resonance) spectrum, an X-ray spectrum, a spectroscopic spectrum, a mass spectrum, and the like. In general, a spectrum includes a waveform-of-interest component and a baseline component. The waveform-of-interest component is, for example, a portion including one or a plurality of peaks, and is the primary analysis target. On the other hand, the baseline component is a component which is not the primary analysis target, and is a component which exists over a wide band in a frequency space (frequency domain).

For example, in observation of the NMR spectrum, the baseline component is attributable to a linking noise caused in a measurement stage, data loss after a digital filter process, a signal component derived from a molecular structure, or the like. A change, a curvature, a slope, or the like having a large period forming a spectral base in the NMR spectrum is the baseline component, or such a spectral base itself is the baseline component.

The article entitled "Nonlinear Residual Minimization by Iteratively Reweighted Least Squares" by Sigl (Juliane Sigl, Nonlinear Residual Minimization by Iteratively Reweighted Least Squares, Comput. Optim. Appl. 64, 755 (2015)) discloses a nonlinear residual minimization method using an IRLS (Iterative Reweighted Least Squares) method.

SUMMARY

In order to improve an analysis precision of a waveform-of-interest component in the spectrum, prior to the spectrum analysis or simultaneously with the spectrum analysis, the baseline component in the spectrum is estimated and is removed from the spectrum. For the estimation of the baseline component, the baseline component is fitted using a mathematical model. As a function defining the model, there are known an Nth order polynomial function, a cosine/sine function, a spline function, a piecewise linear function, and the like.

However, an operation to suitably select a function defining the model and to give suitable parameters for the function normally causes a heavy burden for a user. When such an operation is not suitably executed, the estimation precision of the baseline component is reduced, and, as a consequence, the spectrum analysis precision is reduced. In some cases, the baseline component may be estimated for necessities other than that described above.

An advantage of the present disclosure lies in precise estimation of the baseline component included in a spectrum. Alternatively, an advantage of the present disclosure lies in estimation of the baseline component without causing a heavy burden for the user and removal of the baseline component from the spectrum.

According to one aspect of the present disclosure, there is provided an apparatus for processing a spectrum, comprising: a processor that receives a spectrum which includes a baseline component, and that processes the spectrum, wherein the processor searches an optimum signal model according to a first condition to fit a baseline model with respect to the baseline component, and a second condition to reduce an Lp norm (wherein $p \leq 1$) of a signal model which is another expression of the baseline model, the signal model is a signal model in a predetermined space in which the baseline component is expressed as a sparse signal, and an optimum baseline model determined from the optimum signal model is estimated as an estimated baseline component.

The baseline component basically is a wide-band component in the frequency space, and is expressed as a sparse signal (a signal having many zeros or values near zero) in a predetermined space different from the frequency space. On the other hand, an Lp norm (wherein $p \leq 1$) is known to have a function to increase sparsity of a norm computation target in the process of solving a problem of minimizing the Lp norm. In other words, the Lp norm (wherein $p \leq 1$) is an evaluation value reflecting a degree of sparsity of the norm computation target. Therefore, by searching an optimum signal model according to a first condition that fits a baseline model with respect to the baseline component, and a second condition that reduces the Lp norm, it becomes possible to prioritize the fitting to the baseline component over the fitting to other components. In this process, there is no necessity for selecting a function that simulates the baseline component or for designating parameters to be given to the function. That is, according to the above-described structure, the baseline component can be estimated without causing a heavy burden for the user.

In the above-described structure, the fitting of the baseline model with respect to the baseline component is executed entirely or partially on a frequency axis. Desirably, the fitting is executed for portions in the spectrum other than the waveform-of-interest component or for portions which are highly likely to be the baseline component in the spectrum. The predetermined space is desirably a time space. In this case, the signal model is a signal model on a time axis, corresponding to the baseline model. Alternatively, another space in which the baseline component is expressed as a sparse signal may be set as the predetermined space. A configuration may be employed in which the optimum solution of the signal model is searched using an evaluation value reflecting the first condition and the second condition and minimizing the evaluation value, or a configuration may be employed in which, assuming that the first condition is satisfied to a certain degree, the optimum solution of the signal model is searched according to the second condition; that is, an Lp norm minimizing condition.

With regard to the Lp norm, the function to increase the sparsity of the norm computation target is observed when p is less than or equal to 1. In general, the function becomes more prominent as the value of p is decreased. Therefore, a configuration may be employed in which the value of p is changed according to the contents of the baseline component or the like.

According to another aspect of the present disclosure, the processor subtracts the estimated baseline component from the spectrum. According to another aspect of the present disclosure, the spectrum after the subtraction is set as the analysis target. In addition to the subtraction process of the baseline component, other pre-processes may be applied to the spectrum. According to another aspect of the present disclosure, the first condition is a condition to fit, with respect to a representative portion in the baseline component, a corresponding component in the baseline model.

According to another aspect of the present disclosure, an evaluation value J is defined by an L2 norm of a residual determined from the baseline component and the baseline model and the Lp norm of the signal model, and a condition to minimize the evaluation value J forms the first condition and the second condition. Alternatively, an optimum solution that minimizes the evaluation value J may be searched while alternately executing minimization of the L2 norm and minimization of the Lp norm. The optimum solution does not need to be the optimum solution in a strict sense, and may be a solution which is assumed to be the optimum solution in the computation. For example, a solution at a time when a completion condition is satisfied may be the optimum solution.

According to another aspect of the present disclosure, the processor selects a representative portion in the baseline component from the spectrum, and the residual is a residual between the representative portion in the baseline component and a corresponding portion in the baseline model. A wide-band component serving as the baseline component normally exists over the entirety of the spectrum, but for the purpose of fitting, it is desirable to avoid a portion where components other than the baseline component have precedence or are dominant. Alternatively, a plurality of elements forming the representative portion may be selected in units of elements, from an element array forming the baseline component. If the fitting is executed with respect to the representative portion in the baseline component, the fitting precision; that is, the estimation precision of the baseline component, can be improved. The representative portion is selected based on a manual designation or automatically.

According to another aspect of the present disclosure, there is provided a method for processing a spectrum, comprising: receiving an NMR spectrum which includes a baseline component; and searching an optimum signal model according to a first condition to fit a baseline model with respect to the baseline component, and a second condition to reduce an Lp norm (wherein p≤1) of a signal model which is another expression of the baseline model, wherein the signal model is a signal model in a time space, and an optimum baseline model determined from the optimum signal model is estimated as an estimated baseline component.

The method for processing the spectrum may be realized, for example, as a function of a program. The program may be installed in an information processor device via a network or via a transportable storage medium. The concept of the information processor device includes an NMR measurement apparatus.

BRIEF DESCRIPTION OF DRAWINGS

Embodiment(s) of the present disclosure will be described by reference to the following figures, wherein:

FIG. 4 is a diagram showing an algorithm according to a first configuration;

FIG. 7 is a diagram showing an algorithm according to a second configuration; and FIG. 8 is a diagram showing an algorithm according to a third configuration.

DESCRIPTION OF EMBODIMENTS

An embodiment of the present disclosure will now be described with reference to the drawings.

Figure 1:
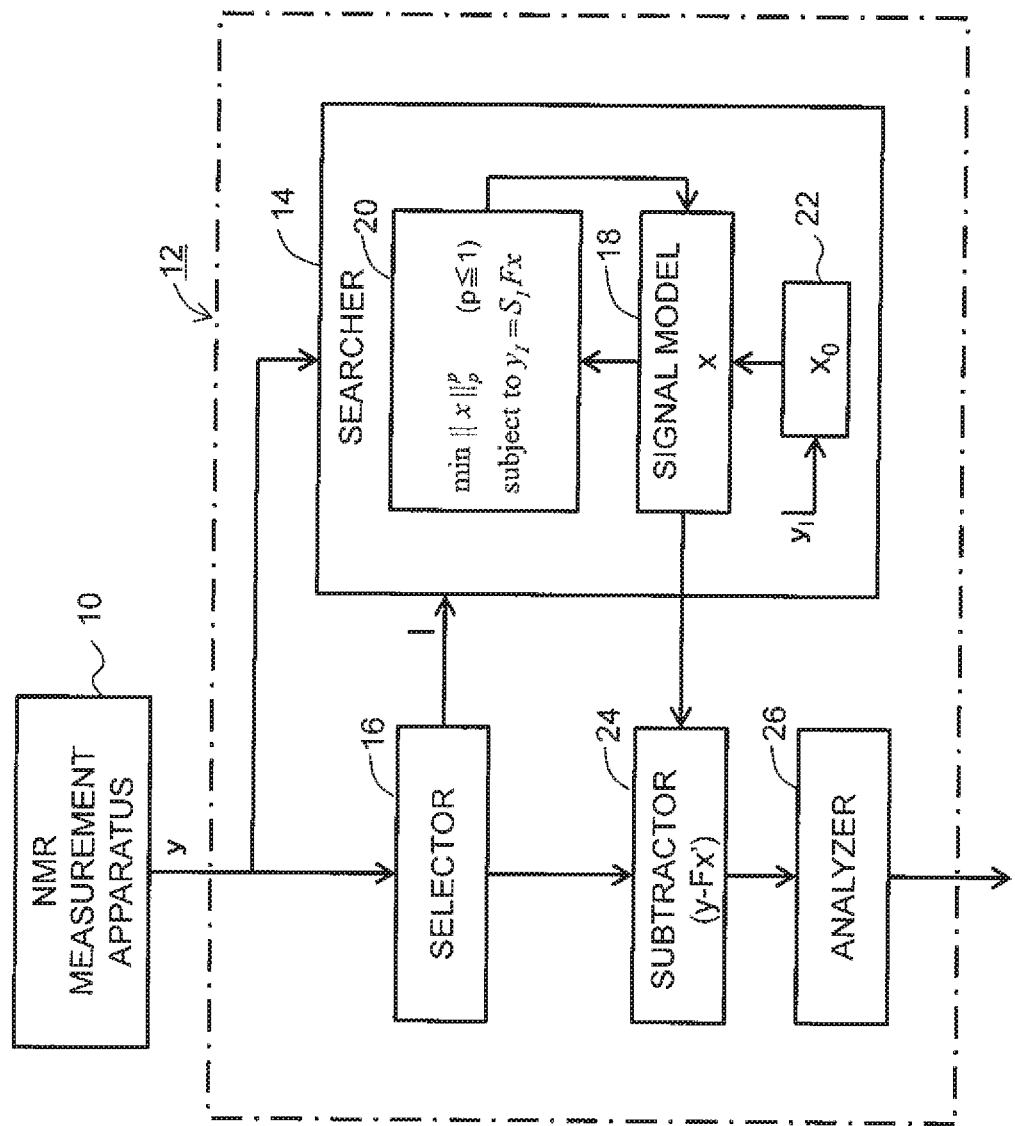
FIG. 1 is a block diagram showing a function of an apparatus for processing a spectrum according to an embodiment of the present disclosure.

FIG. 1 shows an NMR measurement system. The NMR measurement system comprises an NMR measurement apparatus 10 and a spectrum processing apparatus 12. NMR spectrum data are transferred from the NMR measurement apparatus 10 to the spectrum processing apparatus 12. The transfer is executed, for example, via a network, or via a storage medium.

The NMR measurement apparatus 10 comprises a spectrometer and a measurement unit. The measurement unit comprises a static magnetic field generator, a probe, or the like. The static magnetic field generator has a bore serving as a vertical through hole, and an insertion unit of a probe is inserted into the bore. In a head of the insertion unit, a detector circuit which detects an NMR signal from the sample is provided. The spectrometer comprises a controller, a transmission unit, a reception unit, and the like. The transmission unit generates a transmission signal according to a transmission pulse sequence, and the transmission signal is sent to the probe. With this process, an electromagnetic wave is irradiated onto the sample. Then, at the probe, the NMR signal from the sample is detected. A reception signal generated by the detection is sent to the reception unit. In the reception unit, an NMR spectrum is generated by an FFT computation with respect to the reception signal. The NMR spectrum is sent to the spectrum processing apparatus 12 as necessary. Alternatively, the spectrum processing apparatus 12 may be incorporated in the NMR measurement apparatus 10.

In the embodiment, the spectrum processing apparatus 12 is formed by an information processor device such as a computer. FIG. 1 shows a plurality of representative functions of the spectrum processing apparatus 12 by a plurality of blocks. A specific structure of the information processor device will be described later with reference to FIG. 3.

In the following, with reference to FIGS. 1 and 2, a spectrum process executed by the spectrum processing apparatus 12 will be described.

In FIG. 1, an observed NMR spectrum y (hereinafter also referred simply as "spectrum y") is input to the spectrum processing apparatus 12. The spectrum y is given to a searcher 14 and a selector 16. The searcher 14 functions as a search unit, and the selector 16 functions as a selection unit. First, the selector 16 will be described. The selector 16 is a unit for selecting, in the spectrum, a portion designated by a user as a representative portion in the baseline component. In general, the baseline component which is a wide-band component exists over the entirety of the spectrum y. The representative portion is selected such that components other than the baseline component such as the waveform-of-interest component are not set as the fitting target.

Figure 2:
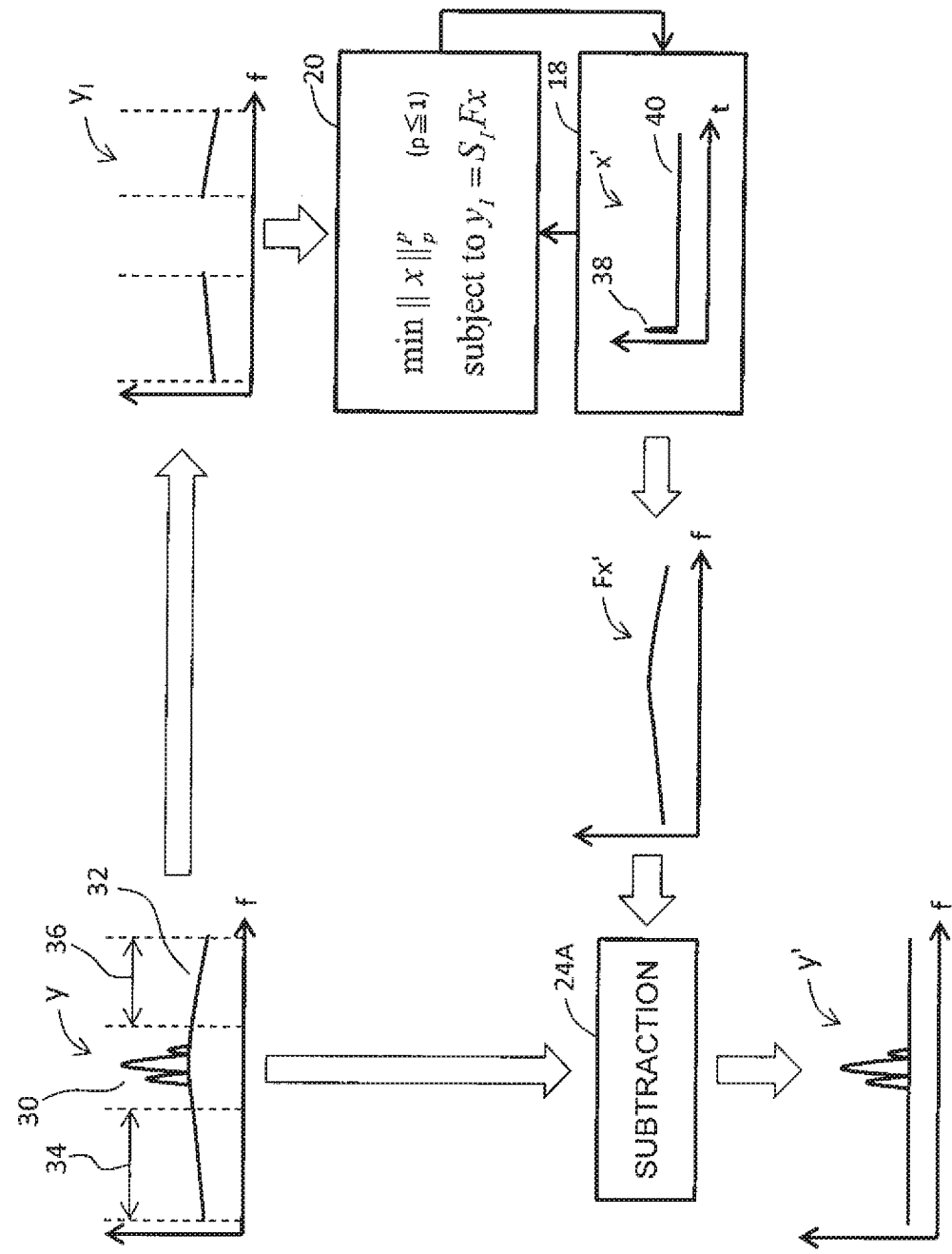
FIG. 2 is a conceptual diagram showing a flow of a spectrum processing.

FIG. 2 exemplifies at an upper left part the spectrum y. The spectrum y includes a waveform-of-interest component 30 and a baseline component 32. For example, in a state where the spectrum y is displayed on a screen, the user designates two sections 34 and 36 on the screen, avoiding the waveform-of-interest component 30. In the baseline component 32, the potions included in the sections 34 and 36 form a representative portion $y_I$. FIG. 2 exemplifies at an upper right part the representative portion $y_I$. Here, for example, I is a coordinate array which identifies a plurality of representative points of the representative portion $y_I$. Alternatively, elements of the representative portion $y_I$ may be sequentially designated in units of the representative points (that is, elements). In this case, it is possible to designate the representative portion $y_I$ while avoiding fine noise. In either case, it is desirable to select as the representative portion $y_I$ a portion which is highly likely the baseline component 32. Alternatively, the representative portion $y_I$ may be automatically selected by waveform analysis or other methods.

In FIG. 1, in the embodiment, the searcher 14 searches an optimum solution of a signal model x according to a presumption condition (first condition) shown by the following Equation (1-2) and a basic condition (second condition) shown by the following Equation (1-1). In the computation, the signal model x is a vector.

[Equation 1]

$$\min \|x\|_p^p \tag{1-1}$$

$$\text{subject to } y_I = S_I F x \tag{1-2}$$

Equation (1-2) described above shows that a baseline component is fitted by a baseline model, and more specifically, shows that the representative portion $y_I$ in the baseline component is fitted by a corresponding portion $S_I F x$ of the baseline model. The signal model x is another expression of the baseline model Fx, and is an expression of the baseline model Fx in the frequency space as a model in the time space. In other words, the baseline model Fx is another expression of the signal model x. F represents a transform matrix from the time space to the frequency space, and $S_I$ represents a sampling matrix in the frequency space which extracts a corresponding portion corresponding to the representative portion from the baseline model. In a specific configuration described later, in the search of the optimum solution of the signal model x, a condition for minimizing the L2 norm of a residual between the representative portion $y_I$ and the corresponding portion $S_I F x$ is taken into consideration.

Equation (1-1) described above shows a condition to minimize the Lp norm (wherein p≤1) of the signal model x. It is known that, when the value of p is less than or equal to 1, the Lp norm functions to increase the sparsity of the solution which is the norm computation target, in the process of solving the problem of minimization of the Lp norm. The value of p is greater than or equal to 0 and less than or equal to 1. When p is 0, the solution may become unstable. Thus, desirably, the value of p is greater than 0 and less than or equal to 1. The spectrum processing apparatus 12 estimates the baseline component utilizing the two properties that the baseline component is a sparse signal on the time axis and that the Lp norm increases the sparsity of the solution in the process of searching the optimum solution.

In general, p is 1, but when the sparsity of the baseline component is expected to be high, p may be set to, for example, 0.75 or 0.5. When the number of elements of the baseline component is N and the number of elements of the representative portion $y_I$ is M, the representative portion $y_I$ is a matrix of M rows and 1 column, and the sampling matrix $S_I$ is a matrix of M rows and N columns.

With regard to the norm, generally, the following expressions represented by Equation (2-1) and Equation (2-2) are permitted. In the present disclosure, the "Lp norm" basically refers to the norm defined by Equation (2-2). The parameter n represent a number of elements of the vector.

[Equation 2]

$$\|x\|_p = (|x_1|^p + |x_2|^p + \ldots + |x_n|^p)^{1/p} \tag{2-1}$$

$$\|x\|_p^p = |x_1|^p + |x_2|^p + \ldots + |x_n|^p \tag{2-2}$$

In FIG. 1, a portion shown by reference numeral 18 is a portion where the signal model x is to be generated (updated), and a portion shown by reference numeral 20 is a portion where the signal model x is to be evaluated. An optimum solution of the signal model x is searched to minimize the evaluation value to be described later. The signal model x at the time when a completion condition is satisfied is an optimum signal model x'.

In the embodiment, an initial signal model $x_0$ is generated from the representative portion $y_I$. Specifically, the representative portion $y_I$ is transformed into a signal in the time space, to generate the initial signal model $x_0$. A portion shown by reference numeral 22 is a portion where this function is realized. Alternatively, the initial signal model $x_0$ may be generated by other conditions, or designated by the user.

FIG. 2 exemplifies at a lower right part the optimum signal model x' which is the optimum solution. The optimum signal model x' has an approximated waveform or a simulated waveform, in the time space, fitted to a signal, on the time axis, corresponding to the baseline component. For example, the optimum signal model x' has a pulse-shape portion 38 having a short time width and a flat portion 40 other than the pulse-shape portion 38. The flat portion 40 is formed as an array of zeros (or values near zero). The exemplified optimum signal model x' is a sparse signal.

In FIG. 1, a subtractor 24 subtracts an estimated baseline component Fx' from the original spectrum y. The estimated baseline component Fx' is an optimum baseline model which is generated by applying a transform matrix F to the optimum signal model x'. An analyzer 26 executes analysis on the spectrum after the subtraction.

FIG. 2 exemplifies at a slightly lower part in the center the estimated baseline component Fx' generated from the optimum signal model x'. The estimated baseline component Fx' is a wide-band component on the frequency axis. The estimated baseline component Fx' is subtracted from the original spectrum (refer to reference numeral 24A), to obtain the spectrum y' after the subtraction. In the spectrum y', the baseline component 32 included in the original spectrum y is removed, and, at the same time, the waveform-of-interest component 30 included in the original spectrum y is maintained.

Figure 3:
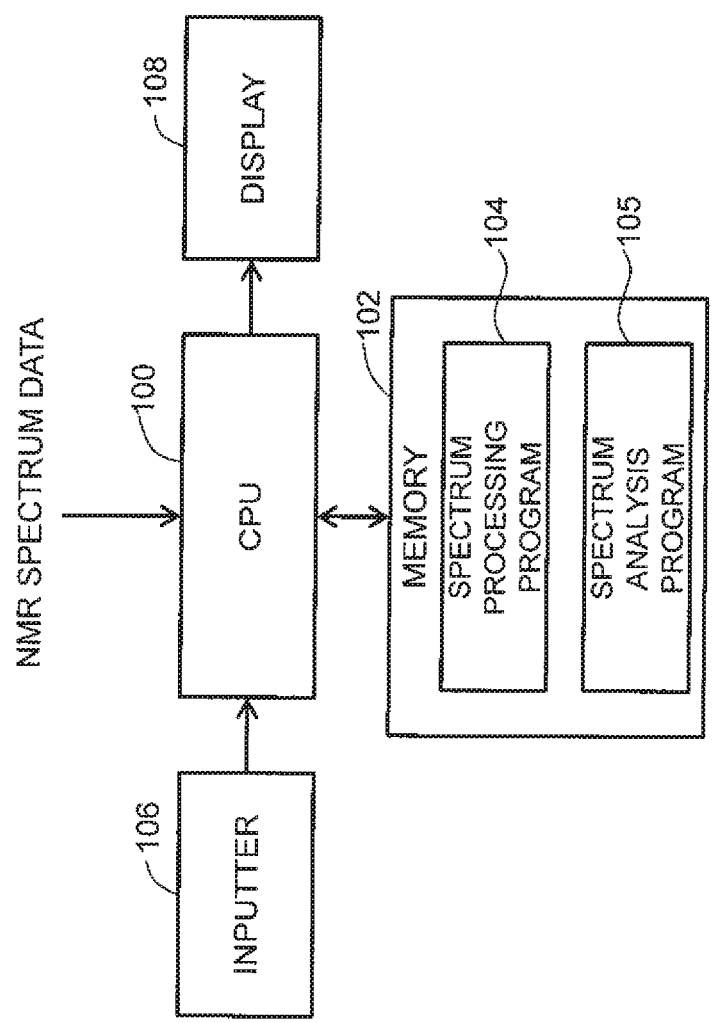
FIG. 3 is a block diagram showing an information processor device functioning as an apparatus for processing a spectrum.

FIG. 3 shows an example structure of an information processor device which functions as the spectrum processing apparatus 12. The information processor device includes a CPU 100, a memory 102, an inputter 106, a display 108, and the like. In the memory 102, a spectrum processing program 104, and a spectrum analysis program 105 are stored. The spectrum processing program 104 is a program for realizing the spectrum process described above with reference to FIGS. 1 and 2. The spectrum analysis program 104 is a program for analyzing the spectrum after the pre-process. These programs 104 and 105 are executed by the CPU 100.

The CPU 100 functions as the search unit, the selection unit, the subtraction unit, and the like. The inputter 106 is formed with a keyboard, a pointing device, or the like, and the representative portion is designated by the user using the inputter 106. The display 108 is formed with, for example, an LCD, and displays a spectrum before the processing. Alternatively, a range of the representative portion or a group of representative points may be designated on the displayed spectrum by the user. Alternatively, another processor which executes the spectrum processing program 104 may be provided. Alternatively, a plurality of processors which execute the spectrum processing program may be provided. The concept of the processor includes various computation devices which execute data computation.

Next, with reference to FIG. 4, a first configuration will be described. In this configuration, p=1, and an optimum signal model is searched as the optimum solution according to a condition to minimize the evaluation value J shown in Equation (3).

[Equation 3]

$$J = \frac{1}{2}\|y_I - S_I Fx\|_2^2 + \frac{\lambda}{2}\|x\|_1^1 \qquad (3)$$

A first term in Equation (3) is a term corresponding to the first condition, and is a portion where the L2 norm for a residual ($y_I - S_I Fx$) between the representative portion $y_I$ of the baseline component and the corresponding portion $S_I Fx$ of the baseline model in the frequency space is to be computed. A second term in Equation (3) is a term corresponding to the second condition, and is a portion where the L1 norm of the signal model x in the time space is to be computed. The term $\lambda$ is a regularization weight.

In general, solving the problem of minimizing the evaluation value requires differentiation of the evaluation value computation formula. While the first term is differentiable, differentiating the second term is difficult. Thus, according to the known IST (Iterative Soft Thresholding) method, the above-described problem is solved. Alternatively, the IRLS (Iterative Reweighted Least Squares) method, the SIFT (Spectroscopy by Integration of Frequency and Time domain) method, or the like may be used. When p=1, use of the IST method is desirable. When p is less than 1, use of the IRLS method is desirable. When a portion where the baseline component is dominant in the time space is known, use of the SIFT method is desirable. The second and third configurations to be described later are based on the IRLS method.

FIG. 4 shows an algorithm of the first configuration. In S10, the spectrum y and a coordinate array I for specifying the group of representative points are read. In S12, the sampling matrix $S_I$ and the transform matrix F are formed. The formulas shown in S14 are formulas that replace the matrix $S_I F$ included in Equations (1) and (3) with B for the purpose of convenience. In S16, based on the spectrum y and the coordinate array I, the representative portion $y_I$ is formed. In S18, a Lipschitz coefficient $L_f$ is computed. The coefficient is a maximum value of a plurality of eigenvalues for $B^H \times B$; that is, a maximum eigenvalue (alternatively, the Lipschitz coefficient $L_f$ may be set to be greater than or equal to the maximum eigenvalue). $B^H$ is a Hermitian transpose of B. In S20, the initial signal model $x_0$ is generated from the representative portion $y_I$. $B^+$ is a pseudo-inverse matrix of the matrix B. In addition, in S20, k is initialized.

In S22, a first completion condition is judged. Specifically, a judgment is made as to whether or not k, which represents a number of computations, is less than or equal to a maximum value $k_{max}$. When $k \leq k_{max}$, S24 and S26 are executed. The computation formula shown in S24 and the computation formula shown in S26 update the signal model x in two stages. The computation formula shown in S24 is determined by once differentiating the first term in Equation (4), and updates the signal model x to minimize the L2 norm of the first term. The computation formula shown in S26 corresponds to the second term of Equation (4). Because it is difficult to differentiate the second term, a soft threshold function soft( ) is used. The function re-forms, based on a computation result $X_{k+1}$ of S24, the value of $X_{k+1}$ as follows.

[Equation 4]

$$\text{If } \lambda/L_f < x_{k+1} \text{ Then } x_{k+1} = x - \lambda/L_f \qquad (4\text{-}1)$$

$$\text{If } -\lambda/Lf \leq x_{k+1} \leq \lambda/Lf \text{ Then } x_{k+1} = 0 \qquad (4\text{-}2)$$

$$\text{If } x_{k+1} < -\lambda/L_f \text{ Then } x_{k+1} = x + \lambda/L_f \qquad (4\text{-}3)$$

With the use of the soft threshold function soft( ) the signal model x is updated to minimize the L1 norm. In S28, k is incremented. A signal model $X_{k+1}$ at the time when the first completion condition described above is satisfied is output as the optimum signal model.

Alternatively, a second completion condition may be added to the above-described algorithm. For example, immediately after S26, an index e defined by Equation (5) may be computed, and the algorithm may be completed when the index e becomes a certain value or less.

[Equation 5]

$$e = \frac{\|x_{k+1} - x_k\|_2^2}{\|x_{k+1}\|_2^2} \qquad (5)$$

The denominator in Equation (5) is the L2 norm of the signal model $X_{k+1}$ after the update, and the numerator in Equation (5) is the L2 norm of a difference between signal models $X_k$ and $X_{k+1}$ before and after the update. Alternatively, another condition may be set as the second completion condition.

Figure 5:
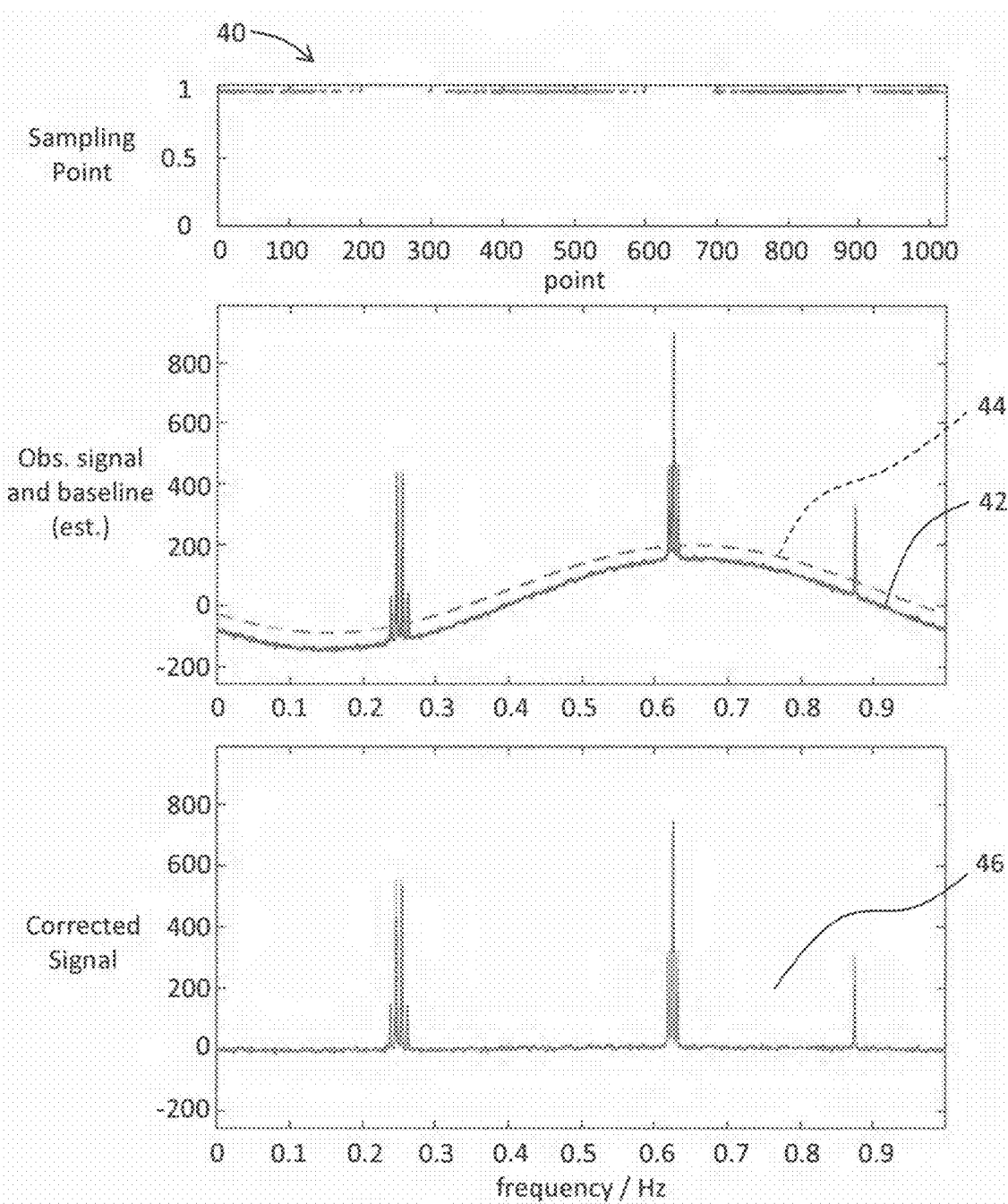
FIG. 5 is a diagram showing a first processing result of a method of processing a spectrum according to an embodiment of the present disclosure.

Next, with reference to FIGS. 5 and 6, an advantage of the first configuration will be described. FIG. 5 shows a first estimation and removal result, and FIG. 6 shows a second estimation and removal result.

In FIG. 5, reference numeral 40 shows a group of representative points forming the representative portion. In this example configuration, a representative point designation method is employed in place of a section designation method. A number of elements in the spectrum in the frequency axis direction is 1024, and a number of the representative points is 256. These conditions are similarly applicable in the second estimation and removal result shown in FIG. 6.

An NMR spectrum 42 shown by a solid line includes a baseline component which is artificially added at a later timing. A result of estimation according to the first configuration for this spectrum is an estimated baseline component 44 shown by a broken line and serving as an optimum baseline model. A result of subtraction of the estimated baseline component 44 from the NMR spectrum 42 is an NMR spectrum 46 after the pre-process.

Figure 6:
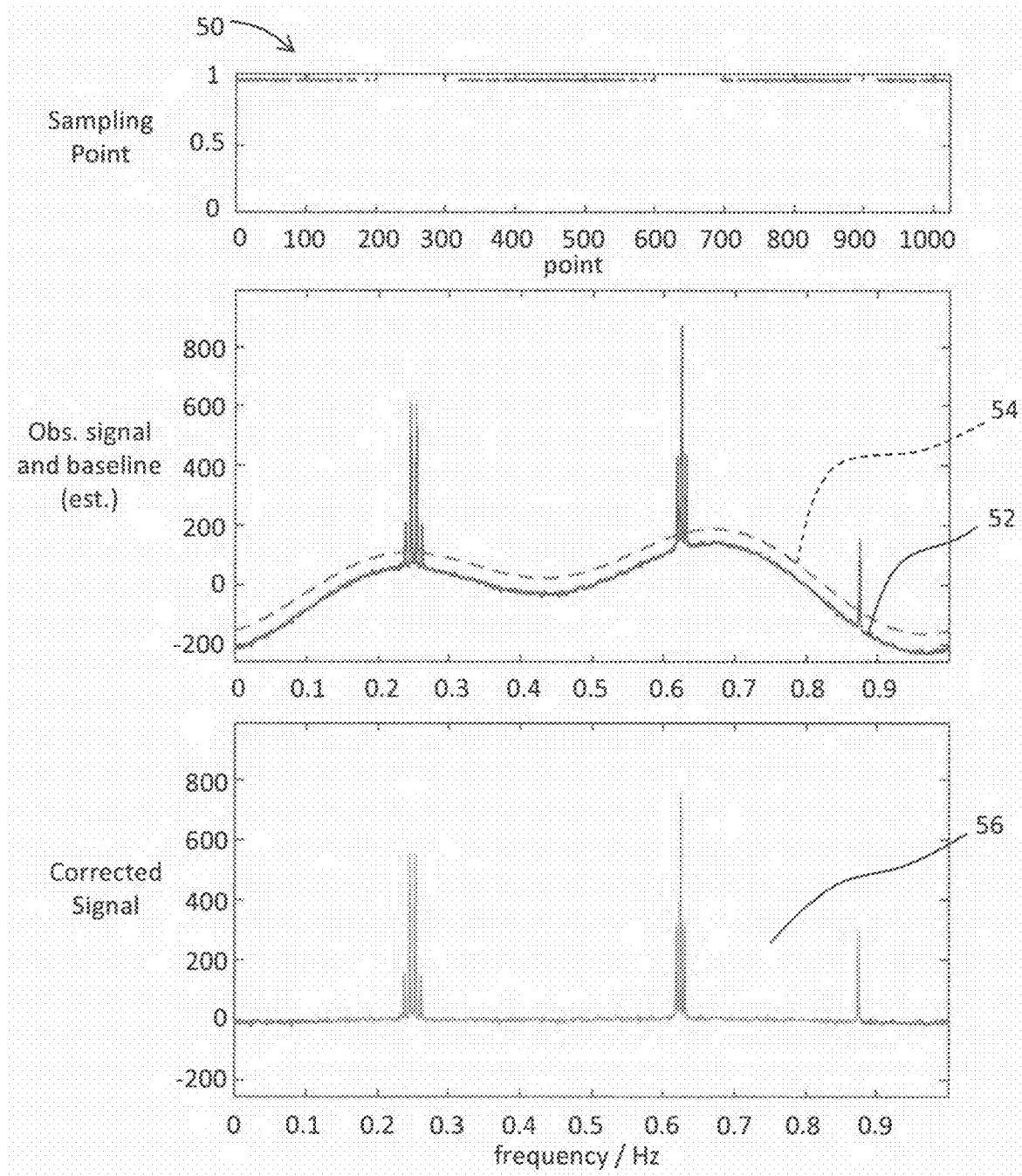
FIG. 6 is a diagram showing a second processing result of a method of processing a spectrum according to an embodiment of the present disclosure.

In FIG. 6, reference numeral 50 shows a group of elements of the representative portion. In this example configuration also, the designations are made in units of elements. An NMR spectrum 52 shown by a solid line also includes a baseline component which is artificially added at a later timing. A result of estimation related to the first configuration on this spectrum is an estimated baseline component 54 shown by a broken line and serving as an optimum baseline model. A result of subtraction of the estimated baseline component 54 from the NMR spectrum 52 is an NMR spectrum 56 after the pre-process.

In both the first and second estimation and removal results, the baseline component which changes with a relatively long period on the frequency axis is almost completely removed. This is due to the use of the L1 norm in the model fitting for the baseline component, under a presumption that the baseline component has the sparsity on the time axis. In addition, in both the first and second estimation and removal results, the waveform-of-interest is maintained.

FIG. 7 shows an algorithm related to a second configuration. The algorithm is according to the IRLS method. The evaluation value J is defined based on Equation (3) described above. For example, p is 0.75. Alternatively, another numerical value which is less than or equal to 1 may be given as p. According to the IRLS method, the second term in Equation (3) which is difficult to differentiate can be expressed as follows, using a weight matrix W.

[Equation 6]

$$J = \frac{1}{2}\|y_I - S_I F x\|_2^2 + \frac{\lambda}{2}\|Wx\|_2^2 \qquad (6)$$

The second term in Equation (6) described above is a computation formula of the L2 norm, which can be once differentiated and twice differentiated.

In FIG. 7, processes similar to the processes of FIG. 4 are assigned the same reference numerals and will not be described again. In S10a, the spectrum y and the coordinate array I are read, and a value of p is defined. For example, 0.75 is given to p. In S30, numerical values are given to a coefficient ε for preventing division by zero and to the regularization weight λ. The subsequent processes of S12~S22 are already described above.

In S32, according to the IRLS method, a plurality of weight elements $w_i$ are defined. In S34, a weight matrix W is defined in which the plurality of weight elements are employed as diagonal elements, and all other elements are set to zero. A computation formula shown in S36 is an updating formula of the signal model x. The formula is determined by once differentiating and twice differentiating Equation (6) described above. By repeatedly executing the computation formula shown in S36, an optimum solution of the signal model x which satisfies the condition to minimize the evaluation value J is determined.

FIG. 8 shows an algorithm of a third configuration. This algorithm is based on the underdetermined IRLS method. This method can be used when the number of elements M of the sample set is smaller than a total number of data N. For example, p is 0.75. Alternatively, another numerical value less than or equal to 1 may be given as p.

Equations (1-1) and (1-2) described above are respectively rewritten as Equations (7-1) and (7-2) based on the IRLS method and using the weight matrix W. Equation (7-2) is identical to Equation (1-2).

[Equation 7]

$$\min\|Wx\|_2^2 \qquad (7\text{-}1)$$

$$\text{subject to } y_I = S_I F x \qquad (7\text{-}2)$$

When the matrix $S_I F$ described above is a wide-width matrix (that is, underdetermined), Equations (7-1) and (7-2) described above can be rewritten into the following equivalent equations based on the underdetermined IRLS method.

[Equation 8]

$$\min\|z\|_2^2 \qquad (8\text{-}1)$$

$$\text{subject to } y_I = S_I F W^{-1} z \qquad (8\text{-}2)$$

$$= B W^{-1} z$$

A solution which satisfies this equation is computed by Equation (9).

[Equation 9]

$$x = W^{-1} B^H (B W^{-1} W^{-1} B^H)^{-1} y_I \qquad (9)$$

The algorithm shown in FIG. 8 is based on this concept. In FIG. 8, processes identical to the processes shown in FIGS. 4 and 7 are assigned the same reference numerals, and will not be described again.

In S10a, the spectrum y and the coordinate array I are input, and then, in S30a, a predetermined value is given to ε. The processes of S12~S22, S32, and S34 are identical to the processes already described. The computation formula shown in S38 is an updating formula of the signal model x, and is the same as Equation (9).

According to the embodiment described above, the baseline component included in the spectrum can be precisely estimated. In this process, designation of functions and designation of parameters to be given to the function are not necessary. Thus, the baseline component can be precisely estimated without causing a heavy burden for the user. The spectrum analysis can be accurately executed on the spectrum from which the baseline component is removed. The spectrum process described above may be applied to spectra other than the NMR spectrum.

The invention claimed is:

1. An apparatus for processing a spectrum, comprising:
   a processor that is programmed to:
      receive a spectrum which includes a baseline component,
      process the spectrum, wherein, when processing the spectrum, the processor is to:
         search for an optimum signal model according to:
            a first condition to fit a baseline model with respect to the baseline component, wherein the baseline model is a frequency space model, and
            a second condition to reduce an Lp norm (wherein p≤1) of a signal model which is another expression of the baseline model, wherein the signal model is a time space model in a predetermined space in which the baseline component is expressed as a sparse signal, wherein the predetermined space is a time space, and wherein the baseline model is defined by applying a transform matrix to the signal model, and generate an optimum baseline model corresponding to the optimum signal model, wherein the optimum baseline model is an estimated baseline component; and perform a spectrum analysis on the spectrum after subtracting the estimated baseline component from the spectrum.

2. The apparatus for processing the spectrum according to claim 1, wherein the processor is further to:

subtract the estimated baseline component from the spectrum.

3. The apparatus for processing the spectrum according to claim 1, wherein the first condition is a condition to fit, with respect to a representative portion in the baseline component, a corresponding component in the baseline model.

4. The apparatus for processing the spectrum according to claim 1, wherein an evaluation value J is defined by an L2 norm of a residual determined from the baseline component and the baseline model and the Lp norm of the signal model, and a condition to minimize the evaluation value J forms the first condition and the second condition.

5. The apparatus for processing the spectrum according to claim 4, wherein the processor is further to:

select a representative portion of the baseline component from the spectrum, and wherein the residual is a residual between the representative portion in the baseline component and a corresponding portion in the baseline model.

6. The apparatus for processing the spectrum according to claim 1, wherein the spectrum is an NMR spectrum.

7. An apparatus for processing a spectrum, comprising:
a means for:
receiving a spectrum which includes a baseline component;
processing the spectrum; and
performing a spectrum analysis on the spectrum after subtracting an estimated baseline component from the spectrum;

wherein processing the spectrum comprises:
searching for an optimum signal model according to:
a first condition to fit a baseline model with respect to the baseline component, wherein the baseline model is a frequency space model, and
a second condition to reduce an Lp norm (wherein $p \leq 1$) of a signal model which is another expression of the baseline model, wherein the signal model is a time space model in a predetermined space in which the baseline component is expressed as a sparse signal, wherein the predetermined space is a time space, and wherein the baseline model is defined by applying a transform matrix to the signal model, and
generating an optimum baseline model corresponding to the optimum signal model, wherein the optimum baseline model is an estimated baseline component.

8. A method for processing a spectrum, comprising:
receiving, with at least one processor, an NMR spectrum which includes a baseline component; and
processing, with the at least one processor, the NMR spectrum, wherein processing the NMR spectrum comprises:
searching for an optimum signal model according to:
a first condition to fit a baseline model with respect to the baseline component, wherein the baseline model is a frequency space model, and
a second condition to reduce an Lp norm (wherein $p \leq 1$) of a signal model which is another expression of the baseline model, wherein the signal model is a time space model in a time space, and wherein the baseline model is defined by applying a transform matrix to the signal model, and
generating, with at least one processor, an optimum baseline model determined from the optimum signal model, wherein the optimum baseline model is an estimated baseline component; and
performing a spectrum analysis on the spectrum after subtracting the estimated baseline component from the spectrum.

* * * * *